United States Patent [19]
Motté

[11] Patent Number: 5,155,395
[45] Date of Patent: Oct. 13, 1992

[54] FILTER CIRCUIT COMPRISING AN AMPLIFIER AND A CAPACITOR

[75] Inventor: Bruno P. J-M. Motté, Nijmegen, Netherlands

[73] Assignee: U.S. Philips Corporation, New York, N.Y.

[21] Appl. No.: 547,554

[22] Filed: Jun. 28, 1990

[30] Foreign Application Priority Data

Jul. 17, 1989 [NL] Netherlands ............... 8901837

[51] Int. Cl.$^5$ ............... H03B 1/00; H03K 5/00
[52] U.S. Cl. ............... 307/521; 328/167; 307/271; 307/556
[58] Field of Search ............... 328/167; 307/520, 521, 307/271, 556, 543, 555; 330/303, 306

[56] References Cited

U.S. PATENT DOCUMENTS

| | | | |
|---|---|---|---|
| 4,110,635 | 8/1978 | Hongu et al. | 307/520 |
| 4,363,004 | 12/1982 | Englund, Jr. et al. | 307/521 |
| 4,472,689 | 9/1984 | Fukushima et al. | 330/306 |
| 4,518,878 | 5/1985 | Moulding | 307/520 |
| 4,535,358 | 8/1985 | Duijkers | 358/158 |
| 4,689,580 | 8/1987 | Fukuda et al. | 330/306 |

FOREIGN PATENT DOCUMENTS 141741 5/1980 Fed. Rep. of Germany.

Primary Examiner—Edward P. Westin
Assistant Examiner—Richard Roseen
Attorney, Agent, or Firm—Bernard Franzblau

[57] ABSTRACT

A filter circuit includes an amplifier having an amplifier element that receives an input voltage and a capacitor that provides an output voltage determined by the input voltage. The base-emitter path of a first bipolar transistor is incorporated in a first current path between the output electrode of the amplifier element and the capacitor and the base-emitter path of a second bipolar transistor is incorporated in a second current path. The base of the second transistor is connected to the capacitor. The capacitor receives charge and discharge currents each of which are base currents and are thus very small so that the capacitor can have a small capacitance and can thus be incorporated easily into an integrated circuit. The circuit can be used as a coincidence detector and as a peak detector.

19 Claims, 2 Drawing Sheets

FILTER CIRCUIT COMPRISING AN AMPLIFIER AND A CAPACITOR

BACKGROUND OF THE INVENTION

This invention relates to a filter circuit comprising an amplifier including an amplifier element having an input electrode coupled to an input terminal for receiving an input voltage and an output electrode coupled to a terminal of a power supply source, a capacitor coupled to the amplifier and an output terminal coupled to the capacitor for making an output voltage available.

In a generally, known circuit the amplifier element, for example, a transistor forms a part of a differential amplifier. In operation the voltage across the capacitor is continuously compared with the input voltage. The capacitor is charged or discharged by an output current of the differential amplifier, which current is dependent on the difference between the input voltages. In a balanced state of the circuit the voltage across the capacitor is substantially equal to the input voltage and the output current is substantially zero, with approximately as much charge being applied to the capacitor as is withdrawn from it. If this state is disturbed for some reason, so that the said voltages become unequal, it is restored after some time. This time depends on the capacitance of the capacitor and on the amplification of the differential amplifier. It is apparent therefrom that the circuit has a time constant and behaves as a low-pass filter.

Another generally known circuit consists of a peak detector in which a capacitor is charged by the peak values of the input voltage of the circuit, whereafter it is discharged. Here, too, a time constant is important.

If a comparatively large time constant is desired for the circuit, the capacitor should have a considerable capacitance. However, the capacitance may be kept small so that the capacitor can be incorporated in an integrated circuit comprising the other components of the circuit if the charge and discharge currents of the capacitor are small. For this purpose circuits have been proposed which use current mirror circuits having a more or less complicated structure in which a current of moderate strength is converted into a very small current. These circuits require a considerable surface area in the integrated circuit.

SUMMARY OF THE INVENTION

The invention is based on the recognition that the aforementioned circuits are not necessary in applications in which the said current attenuation referred to need not be accurate because the value of the time constant is not critical therefore, a much simpler circuit which does not require much surface area in the integrated circuit may be sufficient. According to the invention, a filter circuit of the type described in the opening paragraph is therefore characterized in that a base-emitter path of a first bipolar transistor is incorporated in a first current path between the output electrode of the amplifier element and the capacitor and a base-emitter path of a second bipolar transistor is incorporated in a second current path, the base of the second transistor being connected to the capacitor and the collectors of the two bipolar transistors being coupled to a suitable terminal of the power supply source. In operation, a current equal to the a base current of the first transistor provides a charge current for the capacitor in one direction and a base current of the second transistor provides a charge current for the capacitor in the other direction.

Since transistors usually have a large amplification factor $\beta$, namely of the order of 100 to several hundreds, the charge and discharge currents of the capacitor are very small, as desired. The circuit is very simple and has no critical components.

In one application, in which the value of the time constant is not critical, the filter circuit according to the invention is characterized in that the input voltage is switchable between two values in dependence upon the output signal of a coincidence stage with two pulsatory input signals, the current source only being operative during the occurrence of the pulses of one of the said input signals.

In another application the filter circuit is characterized in that the emitter of the second bipolar transistor is connected to a first input electrode and to an output electrode of a second amplifier element, a second input electrode of which is connected to a second input electrode of the first-mentioned amplifier element and to a first current source, a second current source being also connected to the emitter of the second transistor, or is characterized in that a first input electrode of a second amplifier element is connected to a reference, a second input electrode is connected to a second input electrode of the first-mentioned amplifier element and to a first current source and an output electrode is connected to a terminal of the power supply source, the emitter of the second bipolar transistor being connected to a second current source and to the output terminal of the circuit.

BRIEF DESCRIPTION OF THE DRAWINGS

The invention will now be described in greater detail by way of example with reference to the accompanying drawings in which.

DESCRIPTION OF THE PREFERRED EMBODIMENTS

Figure 1:
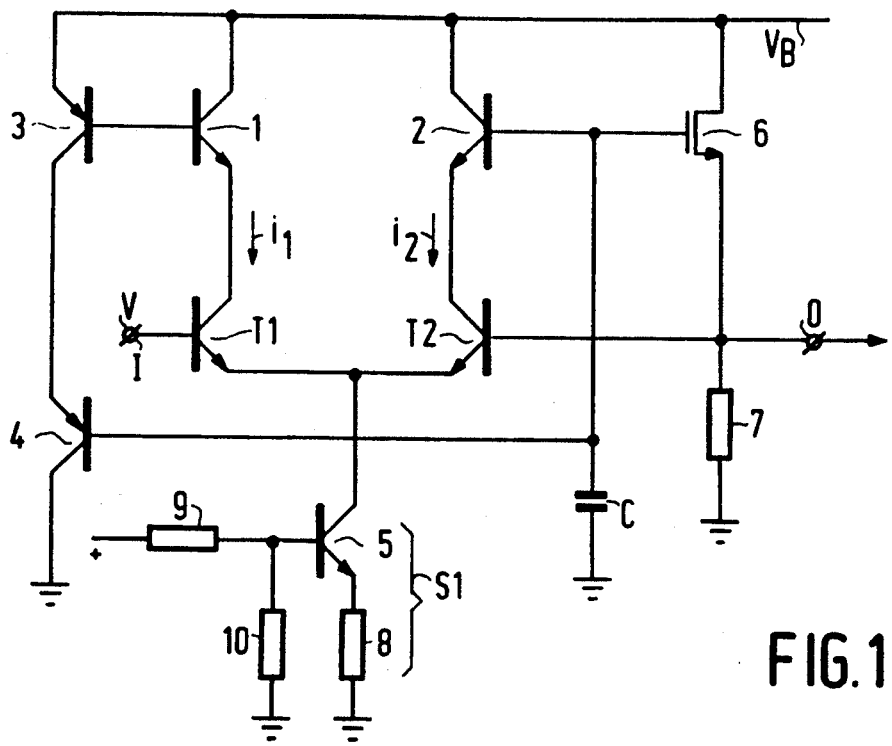
FIG. 1 is a basic circuit diagram of a filter circuit according to the invention.

In FIG. 1 the references T1 and T2 denote two amplifier elements, for example, bipolar transistors of the npn type. The base of each of these transistors constitutes a first input electrode, the emitter constitutes a second input electrode and the collector constitutes an output electrode. The emitters of transistors T1 and T2 are interconnected and connected to the collector of a further npn transistor 5. The collector of transistor T1 is connected to the emitter of an npn transistor 1 whose collector is connected to the positive terminal of a power supply source $V_B$ and whose base is connected to the base of a pnp transistor 3. The emitter of transistor 3 is connected to the said terminal of source $V_B$ and the collector is connected to the emitter of a further pnp transistor 4. The collector of transistor T2 is connected to the emitter of an npn transistor 2 whose collector is connected to the said positive terminal and whose base is connected to a capacitor C, to the base of transistor 4 and to the gate of a field-effect transistor 6 of the NMOS type. The drain of transistor 6 is connected to the positive terminal and the source is connected to the base of transistor T2 and to a resistor 7. The other ends of capacitor C and resistor 7 as well as the negative terminal of source $V_B$ and the collector of transistor 4 are connected to ground. The emitter of transistor 5 is connected to a resistor 8 and the base is connected to the junction point of two resistors 9 and 10. The other end of resistor 9 is connected to a positive DC voltage. The other connections of resistors 8 and 10 are connected to ground.

The base of transistor T1 is connected to an input terminal I for the circuit. In operation, this terminal is connected to a DC voltage V. Transistor 5 and resistor 8 operate as a current source S1 and transistor 6 operates as a buffer circuit for feeding back the voltage across capacitor C to the base of transistor T2 and for making the output voltage of the circuit available, which voltage is substantially equal to the voltage across the capacitor, at an output terminal 0 which is connected to the junction point of the source of transistor 6 and the base of transistor T2 and resistor 7. Transistors T1 and T2 form part of a differential amplifier. The voltage across capacitor C is thereby continuously compared with the voltage V. A current $i_1$ flows through the collector of transistor T1 and the emitter of transistor 1 and a current $i_2$ flows through the collector of transistor T2 and the emitter of transistor 2, the sum of $i_1$ and $i_2$ being always equal to the current of source S1. A current $i_1/\beta_n$ flows to the base of transistor 1. $\beta_n$ is the current gain factor of the npn transistor 1. Similarly, a current $i_2/\beta_n$, which is a discharge current for capacitor C, flows to the base of transistor 2. The base current of transistor 1 is also the base current of transistor 3 so that the collector current of transistor 3, which is also the emitter current of transistor 4, has the value $\beta_p*i_2/\beta_n$. $\beta_p$ is the current gain factor of the pnp transistor 3. A current, which is a charge current for the capacitor and whose value is $\beta_p$ times as small as the emitter current of transistor 4, flows from the base of transistor 4 to capacitor C. In this case it is assumed that transistors 1 and 2, which are incorporated in one and the same integrated circuit, have the same $\beta_n$ and that transistors 3 and 4 have the same $\beta_p$ for the same reason. For all transistors of FIG. 1 it is also assumed that the difference between the emitter and collector currents is negligibly small and for transistor 6 the gate current is assumed to be zero. It is apparent from the foregoing that the charge current has the value $i_1/\beta_n$, i.e. this current is equal to the base current of transistor 1. $\beta_p$ does not occur in this expression.

If the voltages at the bases of transistors T1 and T2 are unequal, capacitor C is charged or discharged by a current $(i_2-i_1)/\beta_n$. Since $\beta_n$ has a large value, this current is very small. The voltage across the capacitor increases or decreases, dependent on the sign of the difference $i_2-i_1$ so that one of the currents $i_1$ and $i_2$ increases while the other decreases. As a result the difference $i_1-i_2$ becomes smaller and after some time it becomes substantially zero. In the balanced state which is then reached, the voltage across capacitor C is substantially equal to V. It is apparent from the foregoing that the circuit of FIG. 1 behaves as a circuit having a given time constant and thus as a low-pass filter with a differential amplifier which has a gain factor of approximately 1 due to the feedback. Transistors 1 and 2 can be considered as elements for supplying a current, namely to the base, which current is $\beta_n$ times as small as the current which is applied to the emitter. Similarly, transistor 4 converts an input current into an output current which is $\beta_p$ times as small. Transistors 1 and 3 may be considered as a current mirror circuit for mirroring the collector current of transistor T1, and transistors 3 and 4 may be considered as a current mirror type circuit for mirroring the base current of transistor 1. Due to the spreads among components and due to temperature effects, ageing and the like the $\beta$'s are not well defined so that the time constant is not well defined either. The circuit of FIG. 1 is thus only usable in applications in which an exact time constant is not required.

Figure 2:
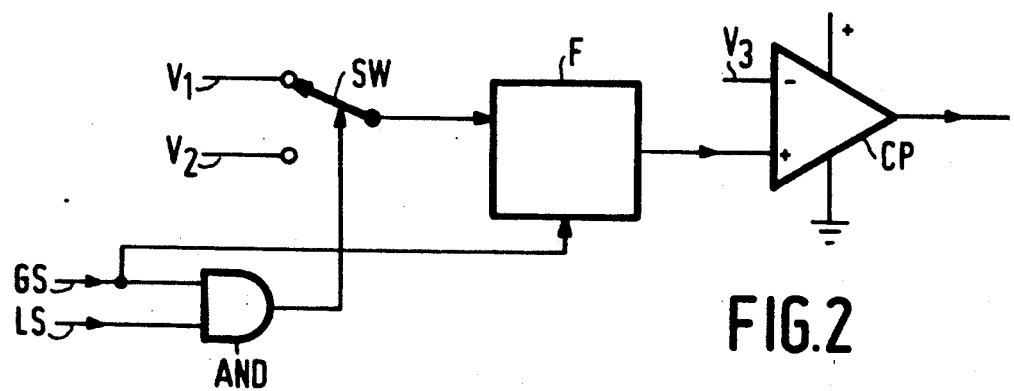
FIG. 2 is a block diagram of a coincidence detector including a slightly modified filter circuit.

FIG. 2 is a block diagram of a circuit in which a filter circuit F is used which is derived from the circuit of FIG. 1. It is a so-called coincidence detector in a picture display device, for example, a television receiver. Such coincidence detectors are described in European Patent Specification 91,719, which corresponds to U.S. Pat. No. 4,535,358 Aug. 13, 1985 and in Netherlands Patent Application 8600945, which corresponds to U.S. Pat. No. 4,949,178 Aug. 14, 1990. The contents of both documents are herein incorporated by reference. The detectors described in these documents require capacitors having a large capacitance. In FIG. 2 the reference AND denotes a stage having an AND function, i.e. a coincidence stage receiving two pulsatory signals, namely a line-synchronizing signal LS which is derived from an incoming video signal by means of a synchronizing signal separating stage and a gate signal GS which originates from a line oscillator. The picture display device comprises a number of parts which are not shown, inter alia, a line-synchronizing circuit for synchronizing the signal of the line oscillator with the signal LS in known manner. The pulses of gate signal GS have the same repetition frequency as the pulses of signal LS, for example, 15.625 kHz in accordance with the European television standard and a duration which is slightly longer than that of these pulses, for example, 5 μs as compared with 4.7 μs. An output of gate AND operates a switch SW whose master contact is connected to the input of the circuit of FIG. 1. A first selection contact of switch SW is connected to a DC voltage $V_1$ and a second selection contact is connected to a DC voltage $V_2$ which is lower than $V_1$. The signal GS is also applied to the filter circuit F in a manner such that the differential amplifier therein is only operative during the occurrence of the gate pulses. The output of circuit F is connected to a non-inverting input of an amplifier CP, an inverting input of which is connected to a DC voltage $V_3$. Amplifier CP operates in known manner as a comparison stage for comparing the output voltage of circuit F with the voltage $V_3$ and for supplying a signal which depends on the established difference.

If the pulses applied to gate AND occur simultaneously, switch SW is in the state shown in FIG. 2 in which voltage $V_1$ is applied to the differential amplifier in the filter circuit F. Whenever a gate pulse occurs, the output voltage of circuit F increases and this voltage substantially does not change therebetween. Capacitor C thus has a hold function. If coincidence subsists, the output voltage of circuit F reaches the target value $V_1$ after some time and subsequently remains constant. Voltage $V_3$ has a value between $V_1$ and $V_2$. At the instant when the voltage at the output of circuit F exceeds the value $V_3$, amplifier CP supplies a positive signal to the line-synchronizing circuit (not shown) for switching certain parts of this circuit in known manner.

If there is no coincidence between the input signals of gate AND, switch SW is in the other state in which voltage $V_2$ is applied to circuit F. The final value at the output of circuit F is substantially equal to $V_2$. In this case or in the case when an initially prevailing coincidence state is lost, the output signal of amplifier CP is negative.

The operation of the circuit of FIG. 2 can be explained with reference to the following numerical example. A value of 25 pF is chosen for the capacitance of capacitor C so that the capacitor can be incorporated in the same integrated circuit as the other components of the circuit. If circuit F is to have a reaction time of 300 line periods and if the difference between the voltages $V_1$ and $V_2$ is equal to 2 V, then it holds that:

$$I*\Delta t = C*\Delta V$$

in which I is the charge or discharge current of capacitor C and $\Delta t = 300*5$ μs, C=25 pF and $\Delta V = 2$ V. Consequently, I is approximately equal to 33 nA. If $\beta_n = 200$, this corresponds to a collector current of approximately 7 μA. The period for generating the switching signal at the output of amplifier CP after coincidence has been established for the first time can be adjusted by way of the choice of the voltage $V_3$. This period is not critical for the application described.

Figure 3:
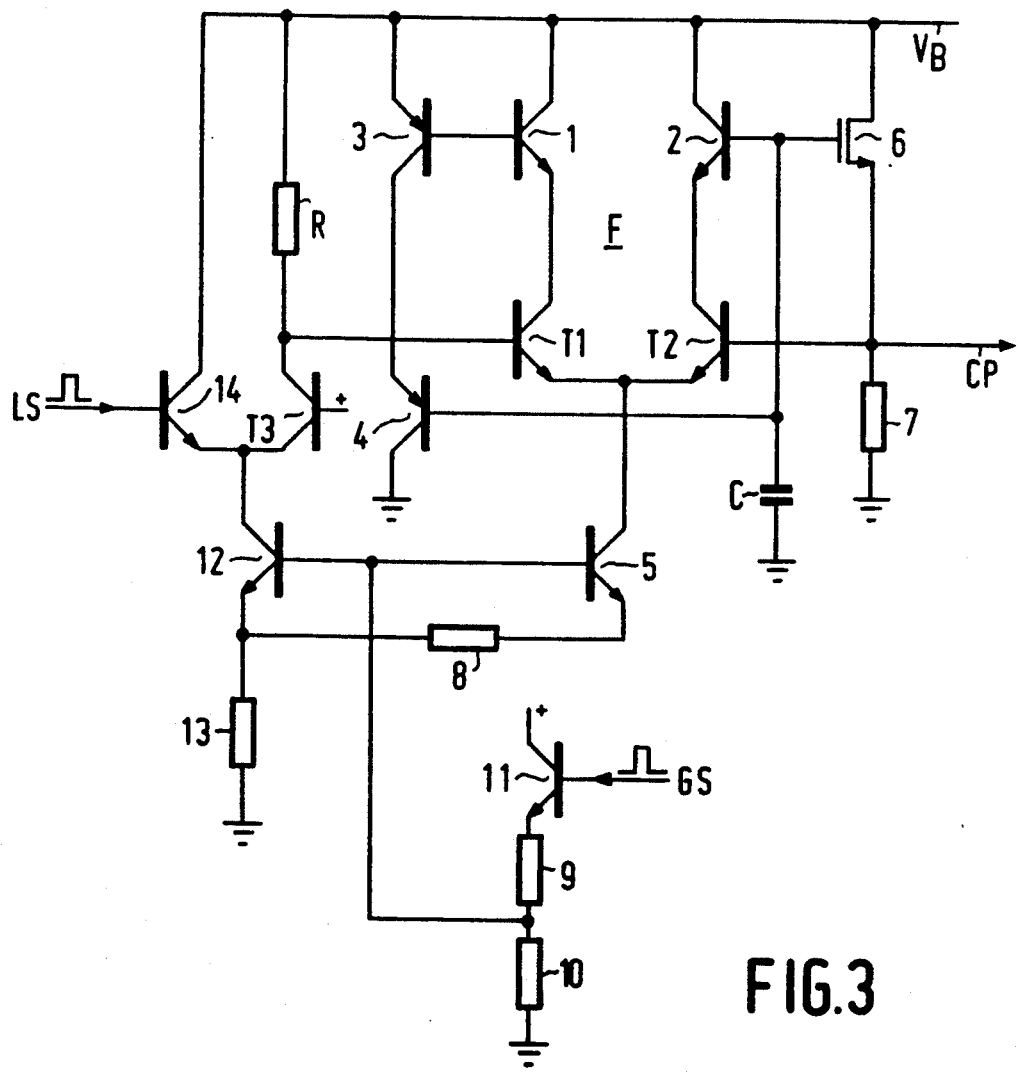
FIG. 3 is a more detailed diagram of some parts of the diagram of FIG. 2.

FIG. 3 shows a more detailed diagram of a part of an embodiment according to FIG. 2. In FIG. 3 the same elements as in FIGS. 1 and 2 have the same reference symbols. As compared with FIG. 1, the filter circuit F is modified because resistor 9 is not connected to a power supply voltage but to the emitter of an npn transistor 11 and because resistor 8 is not connected to ground but to the emitter of a further npn transistor 12 and to a resistor 13 the other end of which is connected to ground. The collector of transistor 11 is connected to a positive DC voltage and the gate signal GS is applied to its base. The base of transistor 12 is connected to that of transistor 5 and the collector is connected to the emitters of two npn transistors 14 and T3. The base of transistor T3 is connected to a positive DC voltage and the line-synchronizing signal LS is applied to the base of transistor 14. The pulses of the two applied signals are directed positively. The collector of transistor 14 is connected to the positive terminal of the source $V_B$. A resistor R is connected to the said terminal at one end and to the collector of transistor T3 and to the base of transistor T1 at the other end.

It is apparent from FIG. 3 that transistors 5 and 12 are only turned on during the occurrence of the gate pulses so that circuit F only operates then. If the pulses in signal LS occur simultaneously with the pulses in signal GS, transistors 12 and 14 are turned on during the occurrence of the pulses in signal LS while transistor T3 is turned off. A given voltage is present at the base of transistor T1. If the said pulses do not occur simultaneously, transistor T3 is turned on, while transistor 14 is turned off. A voltage which is lower than the first-mentioned voltage is now present at the base of transistor T1. These are the above-mentioned voltages $V_1$ and $V_2$, while elements 12 and T3 constitute the gate AND in FIG. 2 with the collector current of transistor T3 as an output signal of the gate.

Figure 4:
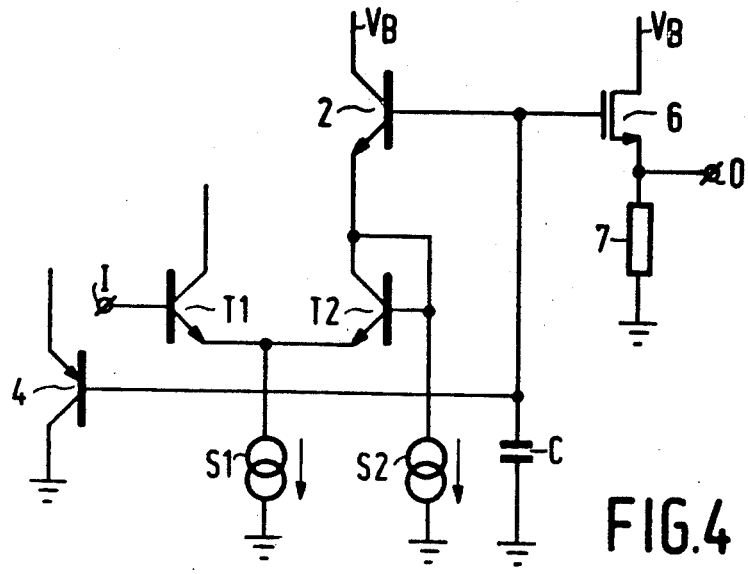
FIG. 4 shows a peak detector including a modification of the filter circuit of FIG. 1.

It will be evident that some details of the circuits described may be implemented in a different way. For example, the amplifier elements T1, T2 and T3 may be replaced by elements other than bipolar npn transistors, for example, pnp or field-effect transistors. The circuit of FIG. 1 may also be modified in such a way that it has a completely different function, with capacitor C still being charged and discharged by base currents. FIG. 4 shows a part of such a modification in which the modification with respect to FIG. 1 relates to the base of transistor T2 which now is not connected to the output terminal of the circuit, but to the collector of T2 and to a current source S2, while the input voltage at the base of transistor T1 is not a DC voltage but an AC voltage, for example, a modulated television signal having a negative modulation. The source of transistor 6 connected to the output terminal O is not connected to the base of transistor T2. In the case of a suitable dimensioning of the circuit it behaves as a peak detector for supplying a demodulated video signal because capacitor C is charged by the base current of transistor 4 during the occurrence of the synchronizing pulses in the video signal and is discharged therebetween by the base current of transistor 2. The last-mentioned current is determined by the source S2 and is substantially constant.

Figure 5:
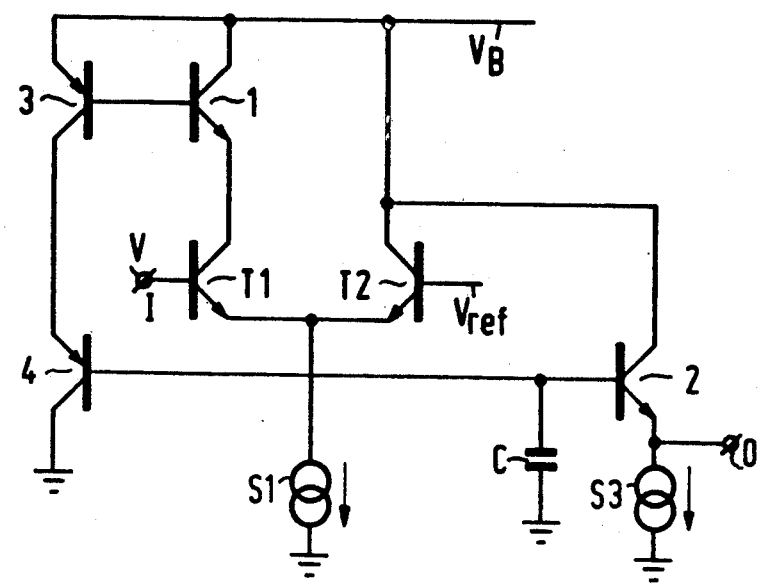
FIG. 5 shows a peak detector including another modification of the filter circuit.

FIG. 5 shows another embodiment of a peak detector in which no feedback is used. As compared with FIG. 1, elements 6 and 7 have been omitted. The emitter of transistor 2 is connected to the output terminal O and to a current source S3. The base is connected to capacitor C. The base of transistor T2 is connected to a reference voltage $V_{ref}$ and the collectors of transistors T2 and 2 are connected to the positive terminal of the source $V_B$. In this case there is also a charge transport for capacitor C in one direction by means of the base current of transistor 4 and in the other direction by means of the base current of transistor 2, which current is substantially constant. In both cases the voltage across capacitor C follows the peak value of the video signal.

I claim:

1. A filter circuit comprising: an amplifier having an input coupled to an input terminal for receiving an input voltage and a first and a second output electrode, a capacitor having a first electrode coupled to a reference voltage and a second electrode coupled to an output terminal for making an output voltage available, a first bipolar transistor having a first main electrode coupled to a power supply source, a second main electrode coupled to said first output electrode of the amplifier, and a base electrode coupled to the second electrode of the capacitor for providing, in operation, a current to the capacitor in one direction, said current being equal to a base current of the first bipolar transistor, and a second bipolar transistor having a first main electrode coupled to the power supply source, a second main electrode coupled to said second output electrode of the amplifier, and a base electrode coupled to the second electrode of the capacitor whereby a base current of the second transistor provides a current for the capacitor in the other direction.

2. A filter circuit as claimed in claim 1, wherein the base electrode of the first bipolar transistor is coupled via a current mirror type circuit to the second electrode of the capacitor.

3. A filter circuit as claimed in claim 2, wherein the second main electrode of the first bipolar transistor is an emitter connected to the first output electrode of the amplifier and said current mirror type circuit comprises third and fourth bipolar transistors with an emitter of the fourth transistor connected to a collector of the third transistor and a base of the fourth transistor connected to the second electrode of the capacitor, an emitter of the third transistor and a collector of the fourth transistor each being connected to a respective terminal of the power supply source, and means connecting a base of the third transistor to the base electrode of the first bipolar transistor.

4. A circuit as claimed in claim 3, wherein the first and the second bipolar transistor are of a given conductivity type and the thrid and the fourth bipolar transistor are of the opposite conductivity type.

5. A filter circuit as claimed in claim 1, wherein the amplifier comprises:
a first amplifier element having a first input electrode coupled to the input of the amplifier and an output electrode coupled to the first output electrode of the amplifier,
a second amplifier element having a first input electrode coupled to a second input of the amplifier and an output electrode coupled to the second output electrode of the amplifier; and the second main electrode of the second transistor is an emitter electrode coupled to the second output electrode of the amplifier, means coupling a buffer circuit between the base electrode of the second bipolar transistor and the second input of the amplifier thereby to feed back the capacitor voltage to said second input electrode of the amplifier, said first input electrode of the second amplifier element being connected to the output terminal of the circuit, and a second input electrode of the second amplifier element being connected to a second input electrode of the first amplifier element and to a current source.

6. A filter circuit as claimed in claim 1, wherein the amplifier includes a first amplifier element having a first input electrode forming said amplifier input and a second amplifier element, and the second main electrode of the second bipolar transistor is connected to a first input electrode and to an output electrode of the second amplifier element, a second input electrode of the second amplifier element being connected to a second input electrode of the first amplifier element and to a first current source, a second current source being connected to the second main electrode of the second bipolar transistor.

7. A circuit as claimed in claim 1, wherein the amplifier includes a first amplifier element having a first input electrode forming said amplifier input and a second amplifier element, and a first input electrode of the second amplifier element is connected to a reference voltage, a second input electrode of the second amplifier element is connected to a second input electrode of the first amplifier element and to a first current source and an output electrode of the second amplifier element is connected to a terminal of the power supply source, the second main electrode of the second bipolar transistor being connected to a second current source and to the output terminal of the circuit.

8. A coincidence circuit comprising:
first and second input terminals for first and second input voltages, respectively,
a coincidence stage which receives first and second pulsatory input signals and derives an output signal,
a controlled switching device coupled to said first and second input terminals and having a control input responsive to the output signal of the coincidence stage, and
a filter circuit comprising;
an amplifier having an input coupled to an output of the controlled switching device and having first and second outputs,
a capacitor coupled to an output terminal for supplying an output voltage,
a first bipolar transistor having a first main electrode coupled to a supply voltage terminal, a second main electrode coupled to said first output of the amplifier, and a base electrode coupled to the capacitor to provide a current to the capacitor in one direction and with said current being equal to a base current of the first bipolar transistor,
a second bipolar transistor having a first main electrode coupled to the supply voltage terminal, a second main electrode coupled to said second output of the amplifier, and a base electrode coupled to the capacitor to provide a current to the capacitor in the other direction,
means connecting said amplifier to a current source, and wherein said current source is controlled by one of said first and second pulsatory input signals so that it is only operative during the pulses of said one pulsatory input signal.

9. A circuit as claimed in claim 8 wherein the coincidence stage comprises an amplifier element having an input electrode for receiving of said first and secon other pulsatory input signals and only being operative during the occurrence of other of said first and second said pulsatory input signals, an output electrode of the amplifier element being connected to a resistor and to the input of the amplifier.

10. A circuit as claimed in claim 8, wherein the output terminal of the circuit is connected to a comparison stage for comparing the output voltage of the circuit with a voltage having a voltage value between the values of the first and second input voltages and for generating a switching signal as a function of such comparison.

11. A time constant circuit comprising:
a capacitor,
a first transistor amplifier element having an input electrode coupled to a signal input terminal and an output electrode,
first means for coupling a circuit output terminal to said capacitor,
first and second transistors each having a base, an emitter and a collector,
a first current path coupled between the output electrode of the first transistor amplifier element and the capacitor, said first current path including a base-emitter path of the first transistor,
means connecting a base-emitter path of the second transistor in a second current path that is coupled to said capacitor and to said first transistor amplifier element whereby a discharge current for the capacitor flows via the second current path, and
second means for coupling the collectors of the first and second transistors to a terminal of the power supply whereby, in operation, a charge current equal to the base current of the first transistor is supplied to the capacitor via the first current path.

12. A circuit as claimed in claim 11 further comprising:
a second transistor amplifier element having an output electrode connected to the emitter of the second transistor and a first input electrode coupled to said circuit output terminal and via a buffer circuit to the capacitor thereby to provide a feedback circuit between the capacitor and the first input electrode of the second transistor element, and wherein said connecting means connects a second input electrode of the second transistor amplifier element to a second input electrode of the first transistor amplifier element and to a current source.

13. A circuit as claimed in claim 12 further comprising:

third and fourth transistors connected in series between terminals of the power supply and with a base of the third transistor connected to the base of the first transistor and a base of the fourth transistor connected to said capacitor such that the base-emitter circuit of the fourth transistor is a part of the first current path.

14. A circuit as claimed in claim 13 wherein the first and second transistors are both of one conductivity type and the third and fourth transistors are both of the opposite conductivity type.

15. A circuit as claimed in claim 11 further comprising:

a second transistor amplifier element connected as a diode and coupled in series circuit with the second transistor and a first current source to terminals of the power supply and with one electrode of said second transistor amplifier element connected to a second input electrode of the first transistor amplifier element and the other electrode of the second transistor amplifier element connected to a second current source.

16. A circuit as claimed in claim 11 further comprising:

a second transistor amplifier element having a first input electrode coupled to a source of reference voltage, a second input electrode coupled to a second input electrode of the first transistor amplifier element and to a first current source, and an output electrode coupled to the collector of the second transistor, and wherein the emitter of the second transistor is coupled to a second current source and to said circuit output terminal.

17. A coincidence circuit comprising:

first and second input terminals for first and second input voltages, respectively, a signal input terminal, a coincidence stage having first and second inputs supplied with first and second pulse-type input signals, said coincidence stage having an output coupled to a control input of a switching device, said switching device selectively coupling said first and second input terminals to the signal input terminal thereby to switch said signal input terminal between first and second values of voltage as a function of an output signal of the coincidence stage, and a filter circuit comprising;

a capacitor, a first transistor amplifier element having an input electrode coupled to the signal input terminal and an output electrode, first means for coupling a circuit output terminal to said capacitor, first and second transistors each having a base, an emitter and a collector, second means for coupling the collectors of the first and second transistors to a terminal of a power supply, a second transistor amplifier element having an output electrode connected to the emitter of the second transistor and a first input electrode coupled to said circuit output terminal and via a buffer circuit to the capacitor thereby to provide a feedback circuit between the capacitor and the first input electrode of the second transistor amplifier element, third means for coupling a second input electrode of the second transistor amplifier element to a second input electrode of the first transistor amplifier element and to a current source, a first current path coupled between the output electrode of the first transistor amplifier element and the capacitor, said first current path including a base-emitter path of the first transistor whereby a charge current equal to the base current of the first transistor is supplied to the capacitor, a second current path coupling the capacitor to the output electrode of the second transistor amplifier element via a base-emitter path of the second transistor whereby a discharge current for the capacitor flows via the second current path, and wherein said coincidence circuit further comprises;

means for supplying one of said first and second pulse-type input signals to the filter circuit so as to make the current source operative only when said one of the pulse-type input signals is present.

18. A circuit as claimed in claim 17 wherein the coincidence circuit comprises amplifier means having an input electrode which receives the other one of said first and second pulse-type input signals and an output electrode coupled to the first input electrode of the first transistor amplifier element whereby said amplifier means is only operative when said other one of said first and second pulse-type input signals is present.

19. A circuit as claimed in claim 17 wherein the circuit output terminal is coupled to one input of a comparison circuit having a second input coupled to a reference voltage $V_3$ where $V_1 < V_3 < V_2$ and $V_1$ and $V_2$ are said first and second input voltage values.

* * * * *